(12) United States Patent
Zetterer et al.

(10) Patent No.: US 12,391,544 B2
(45) Date of Patent: Aug. 19, 2025

(54) HERMETICALLY SEALED TRANSPARENT CAVITY AND PACKAGE FOR SAME

(71) Applicant: Schott AG, Mainz (DE)

(72) Inventors: Thomas Zetterer, Landshut (DE); Antti Määttänen, Tampere (SE); Jens Ulrich Thomas, Mainz (DE); Robert Hettler, Kumhausen (DE); Yutaka Onezawa, Otsu (JP)

(73) Assignee: Schott AG, Mainz (DE)

( * ) Notice: Subject to any disclaimer, the term of this patent is extended or adjusted under 35 U.S.C. 154(b) by 198 days.

(21) Appl. No.: 17/865,062

(22) Filed: Jul. 14, 2022

(65) Prior Publication Data

US 2022/0348457 A1    Nov. 3, 2022

Related U.S. Application Data

(63) Continuation of application No. PCT/EP2021/050825, filed on Jan. 15, 2021.

(30) Foreign Application Priority Data

Jan. 15, 2020  (DE) .................... 10 2020 100 819.8

(51) Int. Cl.
 B81B 7/00   (2006.01)
 B81C 1/00   (2006.01)

(52) U.S. Cl.
 CPC ........ B81B 7/0058 (2013.01); B81C 1/00333 (2013.01); *B81C 2201/0146* (2013.01); *B81C 2203/0118* (2013.01)

(58) Field of Classification Search
 None
 See application file for complete search history.

(56) References Cited

U.S. PATENT DOCUMENTS

| 4,400,870 A | 8/1983 | Islam |
| 8,017,435 B2 | 9/2011 | Leib et al. |

(Continued)

FOREIGN PATENT DOCUMENTS

| DE | 102 58 478 A1 | 7/2004 |
| DE | 10 2019 119 195 A1 | 1/2021 |

(Continued)

OTHER PUBLICATIONS

PCT publication (Year: 2018).*

(Continued)

*Primary Examiner* — Benjamin P Sandvik
(74) *Attorney, Agent, or Firm* — TAYLOR & EDELSTEIN, PC

(57) ABSTRACT

A method for providing a plurality of hermetically sealed packages, including the steps of: providing at least two substrates including a first substrate and a second substrate, at least one of the at least two substrates being a transparent substrate, the two substrates being arranged directly adjoining each other or on top of one another, the transparent substrate defining a circumferential rim and an upper side of each package, the bottom of the package being defined by the second substrate, a respective contact area being defined at contact surfaces between the two substrates; sealing each functional area in a hermetically tight manner by bonding the two substrates along the contact area of each package; and dicing each package by a cutting step or a separating step, a particle jet being used to abrasively remove a material from the transparent substrate by the particle jet.

8 Claims, 11 Drawing Sheets

(56) References Cited

U.S. PATENT DOCUMENTS

| | | |
|---|---|---|
| 9,089,917 B2 | 7/2015 | Sommerfeldt et al. |
| 11,426,989 B2 * | 8/2022 | Logunov .............. B23K 26/324 |
| 2004/0108588 A1 | 6/2004 | Gilleo |
| 2006/0043601 A1 * | 3/2006 | Pahl ........................ H01L 23/10 |
| | | 257/E29.022 |
| 2008/0112037 A1 * | 5/2008 | Pan ........................ H01L 23/10 |
| | | 438/114 |
| 2011/0291529 A1 * | 12/2011 | Numata ................... H03H 9/21 |
| | | 310/348 |
| 2015/0035682 A1 | 2/2015 | Sasaki et al. |
| 2017/0143308 A1 * | 5/2017 | Yamasaki .......... H10N 30/2042 |
| 2021/0078104 A1 * | 3/2021 | Määttänen ......... B23K 26/1224 |
| 2022/0289615 A1 * | 9/2022 | Wynne ..................... G02B 3/14 |

FOREIGN PATENT DOCUMENTS

| | | | | |
|---|---|---|---|---|
| EP | 3 012 059 B1 | 10/2017 | | |
| JP | 56-48148 A | 5/1981 | | |
| WO | WO-2018211176 A1 * | 11/2018 | ........... | B23K 26/009 |
| WO | 2019/161370 A1 | 8/2019 | | |

OTHER PUBLICATIONS

International Search Report and Written Opinion dated Apr. 30, 2021 for International Patent Application No. PCT/EP2021/050825 (14 pages).

\* cited by examiner

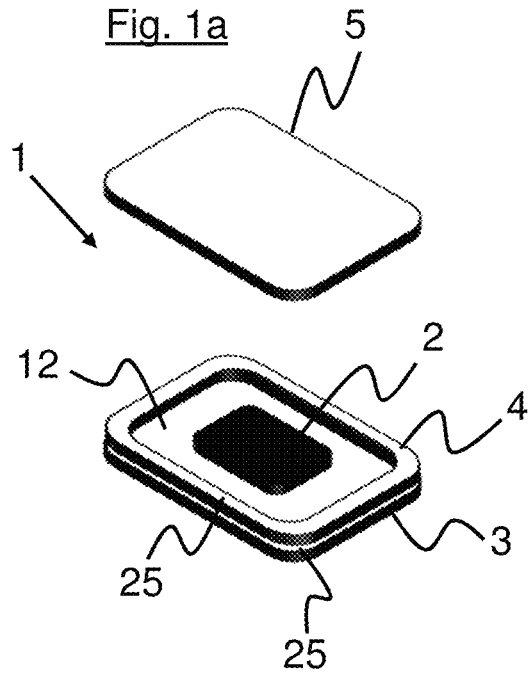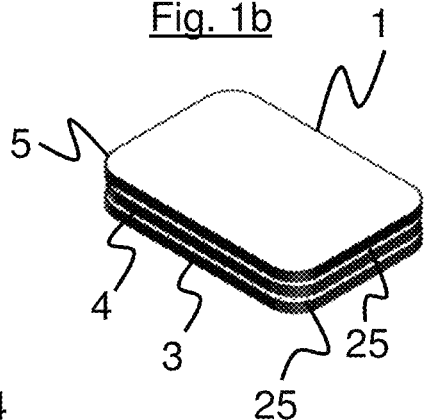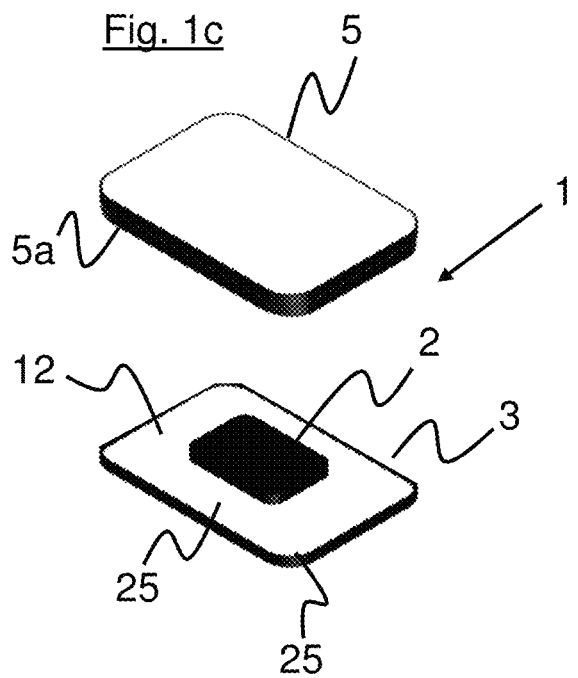

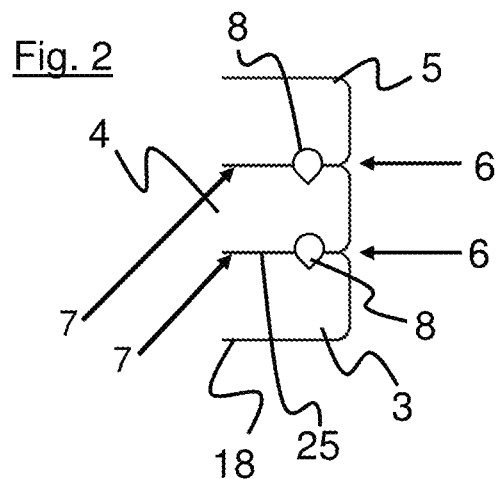
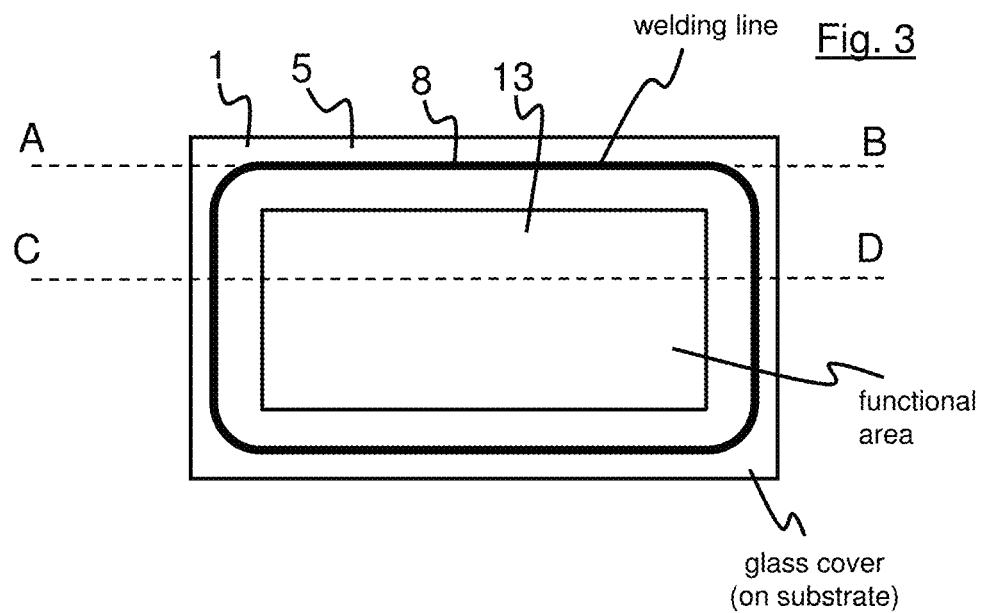
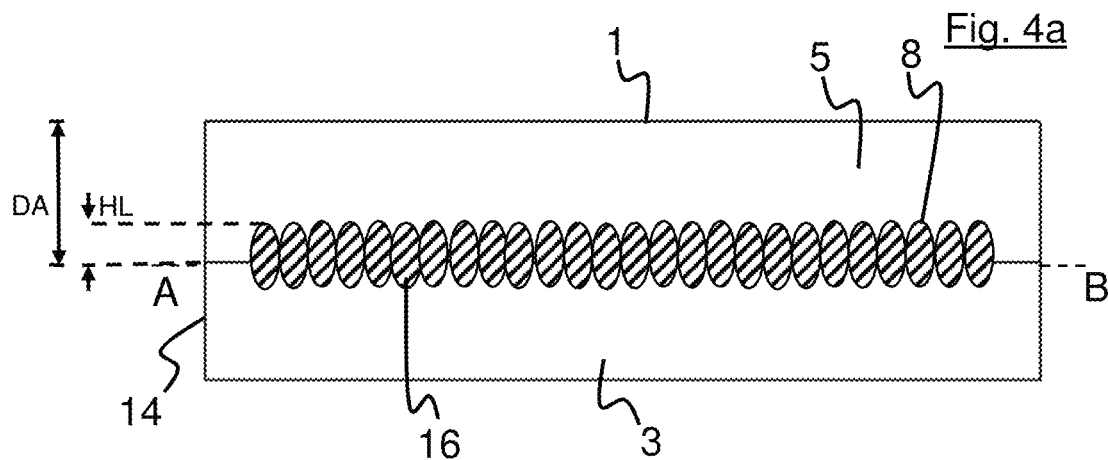

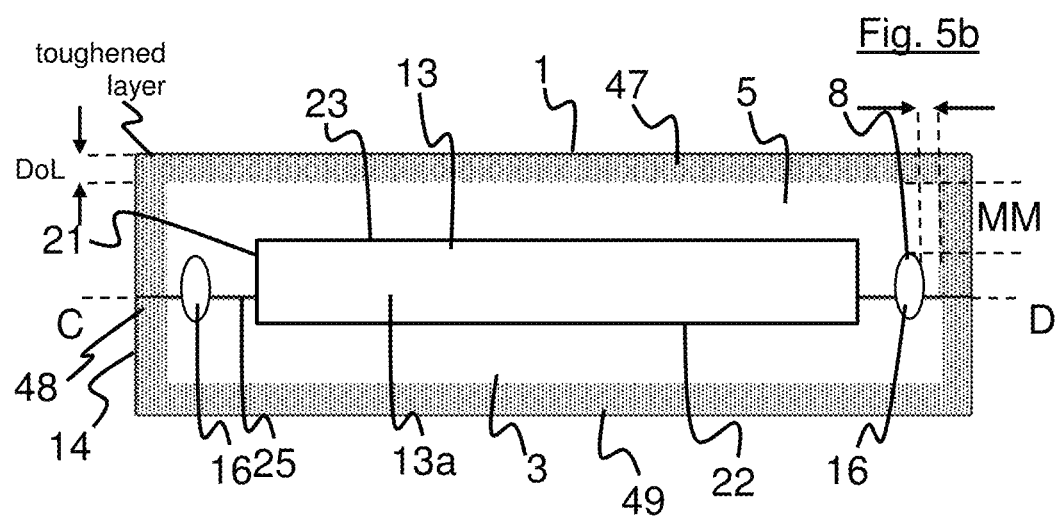
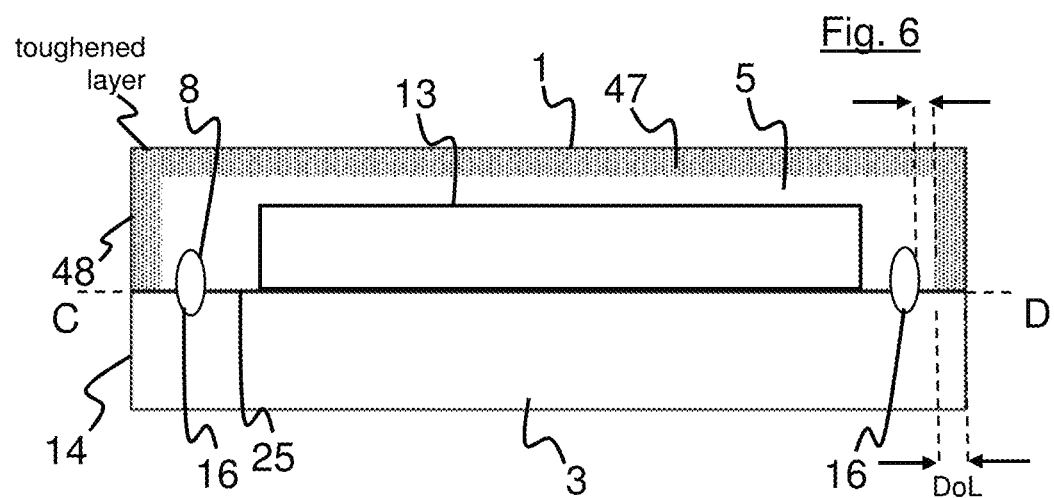

| A | Aligning the wafers and the components to be accommodated |
| B | Superimposed wafer stack |
| C | Laser welding the accommodation cavities, then, if needed, applying protecting agent and lithography |
| D | Separating/cutting the wafer / dicing the packages using particle beam |
| E | Hermetically sealed package |

Fig. 8

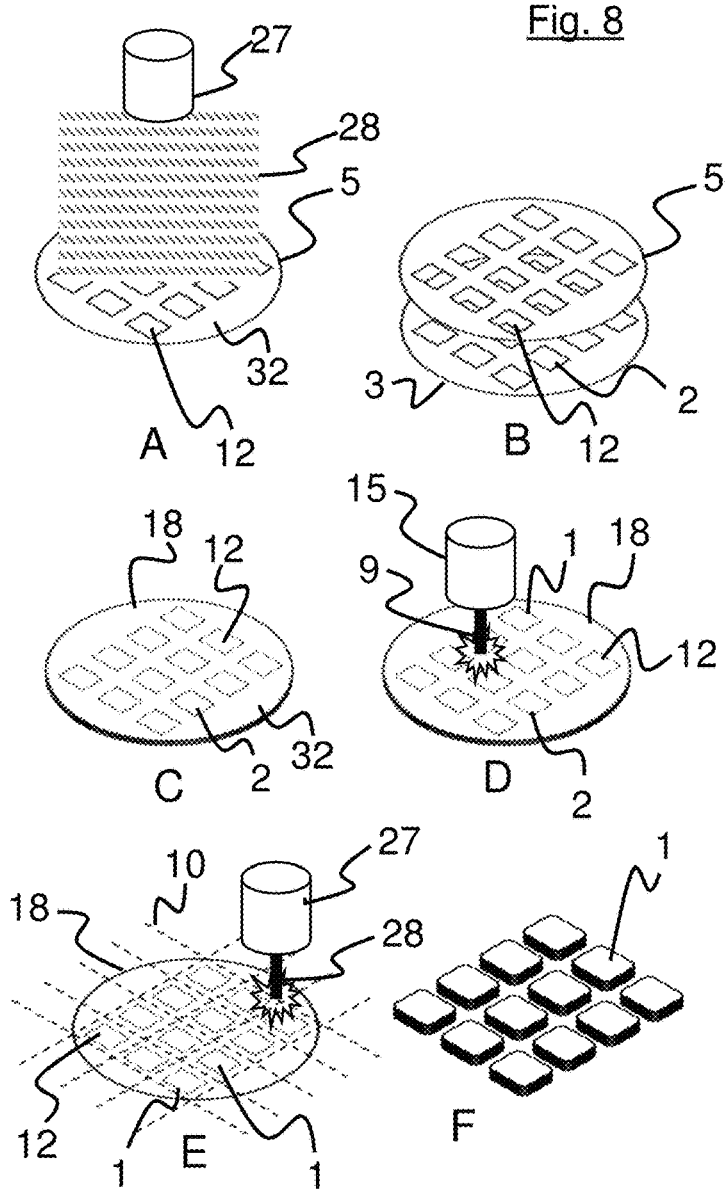

|   | Applying protecting agent to the substrate, lithography |
|---|---|
| A | Producing the cavities using the particle beam |
| B | Aligning the wafers and the components to be accommodated |
| C | Superimposed wafer stack |
| D | Laser welding the accommodation cavities, then, if needed, applying protecting agent and lithography |
| E | Separating/cutting the wafer / dicing the packages, in particular using the particle beam |
| F | Hermetically sealed package |

HERMETICALLY SEALED TRANSPARENT CAVITY AND PACKAGE FOR SAME

CROSS REFERENCE TO RELATED APPLICATIONS

This is a continuation of PCT Application No. PCT/EP2021/050825, entitled "HERMETICALLY SEALED TRANSPARENT CAVITY AND ENCLOSURE FOR SAME", filed Jan. 15, 2021, which is incorporated herein by reference. PCT Application No. PCT/EP2021/050825 claims priority to German Patent Application No. 10 2020 100 819.8, filed Jan. 15, 2020, which is incorporated herein by reference.

BACKGROUND OF THE INVENTION

1. Field of the Invention

The present invention relates to a method for providing a plurality of hermetically sealed packages, and to a transparent package.

2. Description of the Related Art

Hermetically sealed enclosures, which may also be referred to as packages, encapsulations, or housings, can be used to protect sensitive electronics, circuits, or sensors, for example. They allow to apply medical implants, for example in the area of the heart, in the retina, or for bio-processors. Bio-processors which use packages made from titanium have been known and are being employed.

In principle, it has been known to join a plurality of parts and to arrange these parts such that an accommodation area is created in an intermediate space, which can accommodate components. For example, European patent EP 3 012 059 B1 held by Schott Primoceler Oy discloses a method for producing a transparent piece for protecting an optical component. A novel laser process is used for this purpose.

SUMMARY OF THE INVENTION

Sensors can be protected against particularly adverse environmental conditions by a package according to the present invention. This field also includes MEMSs (microelectromechanical systems), barometers, and the like, for example.

Another field of application for a package according to the present invention can be found in a case for a smartphone, in the field of virtual reality glasses and similar devices. A package according to the present invention may also be used for the production of flow batteries, for example in the context of electro-mobility. However, packages according to the present invention can also find application in aerospace, in high-temperature applications, and in the field of micro-optics.

The aforementioned intended purposes have in common that the electronics are subject to high requirements with regard to their robustness. Therefore, the electronics have to be protected against adverse environmental influences. Furthermore, there may be the requirement of ensuring communication with the interior of the package, i.e. with the cavity defined by the package, i.e. for example with electromagnetic radiation, in particular in the visible range and/or in the range of microwave radiation, that is the housing has to be transparent at least partially and/or at least in some areas thereof. The transparency, for example at least for some range of wavelengths of electromagnetic radiation allows for communication, data or power transfer and for measurements, in particular optical measurements of and by the electronics or the sensor arranged in the cavity.

The present invention builds on advances made by SCHOTT. Therefore, the present invention is to be considered in the context of improving packages and in particular making them more resistant, thereby allowing to enhance the robustness against environmental impacts and also to mechanical loads, for example.

A further partial aspect of the present invention is to improve the dicing of the packages in order to reduce the probability of breakouts at the corners and edges of the packages, hence again in order to obtain more robust packages.

Finally, given the fact that material properties can be decisive for later use, for example with regard to biocompatibility, but also material combinations, a further partial aspect of the present invention is to reduce the number of materials and/or bonding materials to be used.

Yet another partial aspect of the present invention is to provide a package which may have any desired outer contour.

For example, the use of lithographic techniques opens up degrees of freedom that go beyond what is possible when using conventional separating processes such as the sawing of wafers. It thus becomes possible, for example, to produce almost any desired geometric contour and thus to enable fitting to already existing complementary structures, as are often encountered in biology, in particular cavities in bone structures, to name an example.

In other words, what is needed in the art is an improved package for a cavity in order to withstand even more adverse environmental conditions and impacts, and, additionally, is to enable the freest possible choice of external shapes or contours and/or dimensions for a package.

Another aspect of the present invention consists in providing the enhancement of the package in a particularly cost-effective way, but also reliably and durably, since the enhanced package also has to assert itself in the competitive situation on the market.

Therefore, in the context of the present invention, a method is presented for providing a plurality of hermetically sealed enclosures or packages. Although the method could be modified without difficulty so as to produce only a single enclosure by this method, it makes sense under economic considerations to produce a plurality of enclosures or packages in one and the same process sequence, since this saves time, effort, and raw material.

A hermetically sealed enclosure or package according to the present invention includes at least a base substrate and a cover substrate, i.e. a first and a second substrate, which define at least part of the package. The package furthermore includes at least one functional area enclosed by the package, in particular a hermetically sealed accommodation cavity for accommodating an accommodation item such as an electronic circuit, a sensor, or an MEMS.

The cover substrate optionally includes a glassy, i.e. vitreous material, or a material that is transparent at least in some portions thereof and at least for one range of wavelengths.

The at least two parts of the package are joined together by at least one laser bonding line to form the hermetically sealed package.

The cover substrate can integrally define both the lateral circumferential rim and the upper side of the package, and the base substrate is hermetically joined to the cover substrate by the same laser bonding line, such that each package is formed by only two parts.

Alternatively or cumulatively, the hermetically sealed package may include an intermediate substrate which defines a portion of or the entire circumferential edge of the transparent package. Thus, the lateral circumferential edge of the package is therefore formed by the section from the base substrate to the cover substrate on at least one lateral side of the package. The lateral circumferential edge is not necessarily perpendicular to the (typically more planar) lower surface of the base substrate and/or not perpendicular to the (likewise more planar) upper surface of the cover substrate, but extends at an angle smaller than the right angle relative to the cover substrate and/or to the base substrate. Optionally, the edge of the package is formed such that it extends at an angle that is smaller than the right angle to both the cover substrate and the base substrate. This can be achieved if the edge is rounded or includes an edge line or break line such that, for example, the portion of the edge at the lower side of the base substrate merges at an angle of less than 90° from the lower surface into the edge, and on the other hand the portion of the edge at the upper side of the cover substrate also merges at an angle of less than 90° from the upper surface into the edge. The edge will then have at least two portions, for example, with surfaces that are oriented differently from one another.

In one embodiment of the present invention, the package has a flank angle at its edge or along the lateral circumferential edge faces relative to the surface normal of the second part of between 10 and 45 degrees, optionally between 15 and 30 degrees, optionally between 18 and 25 degrees relative to the surface normal of the second part.

The package is therefore not cuboid, in particular on its narrow sides, but rather the lateral circumferential rim of the package has an angle relative to the surface normal to the transparent substrate, which does not correspond to the right angle, for example is smaller than the right angle. This angle is referred to as a flank angle, and the laterally circumferential rim or narrow sides are also referred to as the flank of the package. A package adapted in this way has numerous advantages. For example, a package in which the lateral circumferential flank is already "broken" in that it has an angle to the surface of the adjacent substrate that is smaller than the right angle, in particular an angle to the normal of the upper surface of 10 to 45 degrees, can have a lower risk of splintering. A rim prepared in this way can also exhibit a particular bioactivity or biocompatibility.

For example, the lateral circumferential rim may have been shaped from above and from below. The lateral circumferential rim may include two portions which in turn are oriented at an angle relative to one another. The lateral circumferential rim may also be rounded or shaped concavely out of the material of the base substrate and/or the cover substrate or removed therefrom.

The at least one laser bonding line can furthermore enclose the functional area circumferentially at a distance DF therefrom. Furthermore, the cavity can have a depth in the direction of the surface normal of the transparent part, and the depth of the cavity can in particular vary over the surface area of the cavity by less than 30%, optionally by less than 15% of the depth. Optionally, the depth of the cavity can vary by more than 10%, or by more than 5%, or by more than 2% over the surface area of the cavity in this case.

At least one of the substrates, that is to say in particular the cover substrate, is optionally transparent at least in portions thereof and at least for one range of wavelengths. This allows radiation to pass through this area, that is to say in particular through the cover substrate, and in particular to be transmitted into the cavity in order to be measured or processed there. The at least one transparent substrate, which is adapted to be transmissive for radiation, is optionally made of glass, glass ceramics, silicon, or sapphire, or of a combination of the aforementioned materials.

The hermetically sealed package has been joined to form the hermetically sealed package in particular by a laser welding process, by welding together the base substrate, the cover substrate and optionally one or more intermediate substrates by the at least one laser bonding line.

The functional area can advantageously be introduced into the cover substrate and/or into the base substrate by an abrasive process. In other words, material is removed from the substrate by an abrasive way, so that a depression is created in this area, which can be exploited as a functional area or cavity. An abrasive process can also be used for separating, i.e. dicing, the hermetically sealed package from other hermetically sealed packages, i.e. to use the abrasive way as a separating way or cutting way.

Each package defines a functional area such as in particular a cavity which is enclosed in particular by a lateral circumferential rim, a bottom, and an upper side of the package. In other words, the functional area or the cavity is enclosed by the package all around, so that the package forms the circumferential rim, the bottom, and the upper side for the cavity.

For the purposes of the present application, "bottom" and "upper side" are geometrical constructs which may also be any other side with regard to the final orientation of the package. Alternatively, the upper side may be described as a first side, the bottom side as a second side opposite the first side, and the "edge" as the intermediate area between the first and second sides, with the rim typically extending substantially perpendicular to the first and/or second sides. However, in order to facilitate the comprehension of the invention and to approximate the invention to a typical description, terms as "upper side", "bottom", and "circumferential rim" will be used below, as explained.

The upper side of the cavity can then be defined by a top layer such as a first substrate, wafer or sheet, in particular by a cover substrate. Furthermore, the circumferential rim of the cavity may be formed by a second or intermediate substrate, wafer or sheet, the second substrate having a "hole", which hole represents the later cavity. Within the context of the invention, the circumferential rim is optionally also defined by the top layer or the cover substrate, in which case the cavity has been hollowed out of the upper layer. The bottom of the cavity can finally be defined by a lower layer, substrate, wafer, or sheet by arranging the lower layer below the intermediate layer. A cavity or a partial cavity or, more generally, a functional area, may also be hollowed out of the lower layer.

The cavities are in particular in the form of accommodation cavities, which means that electronic circuits, sensors, or MEMSs can be installed in the respective cavities, for example. These aforementioned devices such as in particular electronic circuits, sensors, or MEMS will therefore be enclosed by the package all around, i.e. on all sides, since they are arranged within the accommodation cavity.

In the method according to the invention, at least one transparent substrate and a second substrate are provided, with the at least two substrates being arranged directly adjoining one another or on top of one another. In other words, the at least two substrates are arranged or attached to one another such that they make surface contact to one another without having other layers between the at least two substrates. For technical reasons, there might be minor gas inclusions between the substrate layers, which cannot be avoided and which may be a result of possible unevenness of the substrate layers. The amount of gas trapped between the two substrate layers making surface contact (i.e. in particular in the contact area) can be further reduced by increasing pressure, for example, such as in particular by pressing the at least two substrates against each other, or by a surface treatment of the substrate layers such as a grinding process. Prior evacuation is beneficial. Filling with a type of gas or else with a liquid may also be advantageous, depending on the process parameters and the materials to be employed.

Particularly optionally, a gap that might arise between the substrates has a width of less than or equal to 5 optionally less than or equal to 1 In this case it is possible to laser-weld in such a manner that the welding zone is between 10 and 50 μm in thickness so that a hermetic seal is ensured.

The at least one transparent substrate defines the respective rim and the respective upper side of the respective package enclosing the cavities to be sealed. The second substrate defines the respective bottom of the respective package, and a respective contact area or interface is formed between the at least two substrates, so that each package includes at least one contact area. A contact area may extend over the entire surface area of the respective substrate. Each package has at least one contact surface associated therewith. This means, even if the transparent substrate, viewed as a whole, defines a contact area which extends over the entire surface area of the substrate and which adjoins the second substrate, this contact area is conceptually divided, i.e. subdivided for each respective package, so that each package has a part of this contact area associated therewith.

A contact area does not need to be optically transparent. It might also be advantageous if the lower substrate is opaque in the visible wavelength range. Only the upper substrate through which the laser passes to reach the contact area has at least one spectral "window" such that at least the wavelength of the employed laser can be transmitted through the substrate at least partially or at least in sections thereof. The contact area is adapted such that the laser is able to deposit energy there. The surfaces of the two adjoining substrates may, for example, be joined by optical contact bonding and may furthermore exhibit a roughness in the nanometer range, for example. The laser radiation will at least partially be absorbed at this interface, so that energy can be introduced there. In the sense of the present application, contact area is generally understood to mean an interface at which the incident laser beam can deposit energy so that a bonding or welding process can be performed along the contact area. A simple case of such an interface is the contact area between two adjoining substrates.

In an optional embodiment, all substrate layers are transparent, such that the bottom, the rim, and the upper side and hence the package are entirely made of transparent material.

The substrates are joined to one another in order to form a joint enclosure or package and to hermetically seal the cavities. The step of hermetically sealing the cavities can be carried out by joining the at least two substrates along the contact area of each package. This can advantageously be achieved using a laser welding process. In other words, a laser can be used to deposit energy in the contact area, in particular locally limited to such an extent that it can be referred to as a cold welding process. That is, the thermal energy provided for the joining is focused to the extension of the contact area and only comparatively slowly diffuses into the rest of the material of the package, so that in particular no significant temperature rise will occur inside the cavity. This protects the electronics disposed in the cavity from overheating.

The laser is used to locally melt material of the two substrates along the contact area of the respective package, so that the at least two substrates are bonded locally. For this purpose, a person skilled in the art may refer to EP 3 012 059 B1, for example, which is hereby incorporated by reference.

Prior to the joining step of the at least two substrates, the substrates can be bonded to one another at least temporarily along the interfaces of each package by optical contact bonding.

The at least one transparent substrate may include two transparent adjoining substrates. When using at least two transparent substrates, one to define the rim and a second one to define the upper sides of the cavities, each package will thus have two peripheral contact areas associated therewith. In this case, the respective cavity is optionally hermetically sealed by bonding along the two interfaces using the laser welding process. The two transparent substrates and the second substrate, are thereby firmly welded together, and the cavities are hermetically sealed.

The respective package is diced or singulated by a cutting or separation step. This means that the substrates are cut or separated such that each package becomes separated from the rest of the material.

The method employs a particle jet in order to abrasively remove material from the transparent substrate using the particle jet.

In one example, the at least two substrates are optionally provided in the form of a wafer stack including at least two wafers. In this case, a plurality of hermetically sealed packages can be jointly produced from the wafers or the wafer stack in one and the same fabrication process. This procedure has proven to be particularly cost-efficient, since it implies particularly little scrap of the wafers and thus a particularly low loss of material. In other words, a plurality of hermetically sealed packages is cut out of a wafer stack, which involves a certain amount of material loss, depending on the cut. The material loss can be minimized through the type of cutting process as well as the size and arrangement of the packages.

In an optional embodiment, the transparent substrate is hollowed out using the particle jet to produce the respective cavity. In this case, the particle jet includes in particular a blasting medium that has an abrasive effect on the transparent substrate, for example silicon carbide (SiC), corundum ($Al_2O_3$), garnets, carbides such as WC or TiC, etc., that is for example a material that is harder than the material of the transparent substrate.

The jet flow, jet shape (jet profile) and the intensity of the jet can be set based on the intended size, i.e. in particular on the size of the wafer or of the substrate for producing the packages.

In other words, the particle jet is directed onto the transparent substrate in such a way that it removes material from the transparent substrate and so that the cavity is produced in the transparent substrate by this process of hollowing out. In this embodiment, advantageously, the transparent substrate may have a greater thickness to provide a larger space for hollowing out the cavity from the bulk of the substrate, as the depth of the cavity can be increased in the case of thicker substrates. The particle jet is directed over the surface of the transparent substrate to remove material from the transparent substrate in a most uniform possible way so as to obtain a removal depth as consistent as possible in the transparent substrate. The size or surface area of the cavity can be adjusted here through the surface area which is swept by the particle jet as it is directed over the transparent substrate. The particle jet is directed onto the transparent substrate from one side and is moved successively over the surface of the transparent substrate, for example in such a way that the cavity is worked out of the transparent substrate. In the example in which the transparent substrate is provided in the form of a wafer, a plurality of cavities can be produced in the wafer using the particle jet, by directing the particle jet to different locations on the wafer, while omitting webs to which the particle jet is not directed. These webs will later define the peripheral walls of the cavities.

Alternatively or cumulatively, a resist can be applied onto a surface area of the substrate, and the resist can in particular be applied in a patterned manner, further in particular by lithography. The resist can be applied in thin strips or webs, for example. The resist will protect the substrate surface from being ablated, so that with continued ablation in the unprotected areas the cavities will be formed and in the areas protected by the resist webs will remain, for example.

The transparent substrate has a substrate thickness. Optionally, the particle jet removes at least 30% of the substrate thickness from the transparent substrate within the range of the respective cavity, optionally at least 50%, optionally 70% or more of the substrate thickness in order to produce the cavity in the transparent substrate. In one embodiment, the particle jet removes at least 100 optionally at least 150 optionally at least 200 optionally at least 250 μm of the substrate thickness of the transparent substrate.

Thus, in this embodiment the particle jet is directed in such a way that an ablation depth is achieved in the transparent material, which provides a depth as uniform as possible of all cavities in a substrate. The depth of the cavity optionally varies by less than 30% of the depth over the surface area of the cavity, optionally by less than 15% of the depth. The depth of the cavity may optionally vary by more than 5%, possibly by more than 2% over the surface area of the cavity, and the depth of different cavities within a substrate can vary similarly.

The at least one transparent substrate is optionally made of glass, glass ceramics, silicon, sapphire, or a combination of the aforementioned materials. Examples of such a glass combination include a glass/silicon combination, glass/silicon/sapphire combination, and a silicon/sapphire combination. The one or more further substrate(s) may also include or consist of $Al_2O_3$, sapphire, $Si_3N_4$, or AlN. Combining a transparent substrate with a different type of substrate allows to obtain semiconductor properties, for example. Coatings may also be employed, e.g. piezo-resistive Si layers, in particular for pressure sensors, or thicker layers for micromechanical applications such as pulse measurement via an MEMS.

Alternatively, at least one substrate or wafer consists of a material that differs from that of the transparent substrate. For example, the substrate defining the bottom of the cavities may optionally be provided in the form of an optically non-transparent material which can optionally have other properties, such as in particular electrical conductivity or electrical isolation. However, the lateral rim and the upper side of the packages are optionally made of transparent material. Optionally, all substrates are provided based on transparent material. A particular advantage of a transparent package made of glass or predominantly made of glass, in particular borosilicate glass, is its chemical inertness.

The one or more substrate(s) may also have a coating. For example, AR coatings, protective coatings, bioactive films, optical filters, conductive layers, for example made of ITO or gold, may be employed, as long as it is ensured that transparency or at least partial transparency is provided for the employed laser wavelength in the irradiation area of the laser.

The step of dicing the respective package can optionally be executed by a particle jet cutting process. In this case, material is ablated from the package in a manner so as to separate the package.

For example, a particle jet can be used here, which is directed circumferentially around the cavity, and this several times, if necessary, until the track that the particle jet erodes out of the package reaches the thickness of the package so that separation from the material surrounding the package is achieved. Such a particle jet can be used to act locally or in a linear manner on the substrate in order to intensify the abrasive effect there and to thus achieve a cutting effect more quickly.

Optionally, a particle jet with a 2-dimensional ablation or removal effect is used. The particle jet optionally exhibits good homogeneity throughout an application area, which application area can be large in comparison to the size of an individual cavity. In other words, it is optional to use an abrasive process in such a way that the entire surface or a large part of the surface of the substrate to be ablated is ablated simultaneously from one side, i.e. the surface is not ablated in sections thereof but across the entire surface area. For this purpose, a particle jet with a large 2-dimensional effect can be used. In order to protect areas that are not to be removed, these areas can be provided with a protective agent, for example a photoresist.

The particle jet can be directed alternately onto the upper surface of the transparent substrate and onto the lower surface of the substrate, so that the package is separated from both the upper side and the lower side and material is removed there. In other words, the particle jet acts as a cutting way which can be used to cut through the substrate. With appropriate beam control of the particle jet, for example in terms of beam width and beam intensity, a cutting behavior will be achieved, so that material is continuously removed from the package.

Therefore, in one example, the particle jet in its functionality to cause a cutting process is directed onto the transparent substrate in a 2-dimensional manner in order to achieve the abrasive effect and a cutting effect over the entire application surface of the substrate, which optionally is an entire face of the substrate. For example, the 2-dimensional blasting process can be used in combination with the application of resist as explained above, so that the areas protected by the resist will not be ablated. A 2-dimensional blasting process optionally allows to better equalize the depth of the cavities.

Particularly optionally in the cutting process, the particle jet produces a flank angle on the package relative to the surface normal of the transparent substrate of between 10° and 45°, optionally between 15° and 30°, optionally between 18° and 25° relative to the surface normal of the transparent substrate. In other words, the package produced using this method may optionally have flank angles of between 10° and 45°, optionally between 15° and 30°, optionally between 18° and 25° relative to the surface normal of the transparent substrate.

The particle jet can be guided in such a way that the outer contour of the package can be freely defined. In other words, the contour of the package only depends on how the particle jet is moved over the substrate. In contrast to the prior art with its known cutting methods, this allows to produce free shapes, for example, so that not only square shapes can be produced but circular shapes as well, for example, which is advantageous for the manufacture of lenses, for example. Furthermore, oval or hexagonal shapes, rectangular shapes and any other arbitrary outer contour of a package can be produced as well.

The transparent substrate typically has a thickness of less than 500 Optionally, the thickness of the transparent substrate is less than 300 μm, optionally less than 120 and optionally less than 80 μm.

At least one of the lateral circumferential rim, the bottom, or the upper side is transparent for a range of wavelengths, at least in portions thereof. In other words, it is sufficient if at least one component of the package is transparent for an optional wavelength range at least in a portion of the component, and the wavelength range is known in advance and the material can accordingly be adapted to the wavelength of the laser to be used, if desired.

The package is welded using a laser welding process to form the hermetically sealed package. In other words, the rim, bottom, and top consist of more than one piece, for example of two or three parts or even more, and the parts are laser-welded to one another to complete the package.

According to a further embodiment, the package may have been chemically toughened at least partially and/or in sections thereof, for example as described in SCHOTT's own patent application DE 10 2019 119 195, and this aforementioned disclosure is hereby incorporated by reference. For example, one surface of the package is chemically toughened, i.e. for example the upper side. It is also possible that the upper side and the rim are chemically toughened. Optionally, the upper side and the rim and the lower side are chemically toughened, so that the respective surface of the upper side and the lower side as well as the respective rim, i.e. the rim, is chemically toughened.

Also within the scope of the invention is a transparent package with a hermetically sealed accommodation cavity for receiving an accommodation item. An accommodation item is an electronic circuit, a sensor, or an MEMS, for example.

Such an enclosure or package can be used as a medical implant, for example, or as a sensor, in particular as a barometer, blood gas sensor, or glucose sensor.

The application of the hermetically sealed, transparent enclosure as a medical implant is particularly interesting. The use of biologically inert materials as the encapsulation material is also particularly advantageous here: in particular borosilicate glasses, fused silica glasses and bioglasses such as 45S5 are to be mentioned here.

Since the human body is not a static system, implants might become displaced from their original location during their lifetime. Such migration can be prevented if the tissue grows into the cover material of the implant. In other words, the package or at least one substrate of the package may be prepared or adapted to grow together with tissue.

This growing together can be further promoted by roughening the respective surface so as to increase the effective surface area. With particularly thorough or strong roughening and the appropriate substrate or glass it is even possible to integrate such a surface into the biomass as a "scaffold". In other words, the package or at least one substrate of the package may be designed to form or provide a support structure for tissue, so that the tissue can create a positive fit with or enclose the support structure. The package will thus be anchored in the tissue.

It has been found that the edges roughened or shaped or abraded by the abrasive sandblasting process presented herein can be adapted or prepared to form a bond with the tissue such that they have particularly advantageous properties for forming a firm connection or growing together with the tissue. The dicing method described in the present application makes it possible to provide the edges and surfaces of the bio-implants with a surface that is advantageously prepared or adapted for later becoming connected to the tissue. In other words, the abrasive separation process allows to prepare the surface for later use in an organism or in tissue and/or to provide a support structure for this purpose. The flank of the package that is broken or prepared for this purpose is therefore equipped with a bioactive finish, since it provides increased adhesiveness for the tissue and promotes "nestling" or implantation of the package in tissue. The flank therefore has a tissue support structure.

Particularly advantageously, with the process step of masking, the areas that may be necessary for the functionality of the hermetically sealed implant for an optical functionality can be omitted from the surface roughening. This means that implants separated from a wafer using this method can have smooth surfaces optimized for optical communication, which may be transparent, for example. At the same time, the same package can also have surfaces for connecting to tissue, so that both surface forms can be combined in the same package.

The (at least partially transparent) package according to the invention has a laterally circumferential rim made of transparent material provided by a first part, and a bottom provided by a second part, which together completely enclose the accommodation cavity all around. The at least two parts of the package are joined using a laser welding process to form the hermetically sealed package.

The first part integrally defines the lateral circumferential rim and the upper side of the package so that each package is formed from only two parts. In other words, two substrates are provided, the first substrate having a hollowed-out cavity at its inner side, and this hollowed-out cavity is closed by the second substrate. The transparent substrate which defines the lateral circumferential rim and the upper side of the cavity, combined with the second substrate which provides the bottom of the cavity, together form the transparent package made up of two parts.

In one example, the package has a flank angle to the surface normal of the second part of between 10° and 45°, optionally between 15° and 30°, optionally between 18° and 25° relative to the surface normal of the second part at its rim or at the circumferential rim faces. The same angle can be adjusted at the rims of the package, and optionally, a continuous flank with the aforementioned angles is formed on all circumferential rims, so that the sharpness of rim of the package is mitigated.

The package may, for example, have a size of 3×3 mm or less, in particular the accommodation cavity has a diameter of less than or equal to 2 mm. A package may, for example, also have a size of 0.2×0.2 mm or less. On the other hand, the package may also be made larger, depending on the area of application, with several centimeters in length and more being possible. For practical reasons, governed by the optional fabrication method, which should however not be understood as a size limitation per se, a size limit is simply given by the size of the wafers to be cut. However, the use of wafers for the fabrication is considered to be only one example. It is entirely possible, for example, to use glass sheets which can also have larger dimensions than typical wafer dimensions, for producing the package.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 1a is a view of the opened accommodation cavity from above;

FIG. 1b is a perspective view of a sealed package;

FIG. 1c is a further view of an opened accommodation cavity;

FIG. 2 is a detail of the joining area of a package that includes three substrates;

FIG. 3 shows a plan view of a further embodiment of a package;

FIG. 4a is a sectional view along line A-B of an embodiment of a package as shown in FIG. 3;

FIG. 5b is a sectional view along line C-D of an embodiment of a package as shown in FIG. 3;

FIG. 6 is a sectional view along line C-D of an embodiment of a package as shown in FIG. 3;

FIG. 8 illustrates another method for producing a package according to the invention;

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 4B:
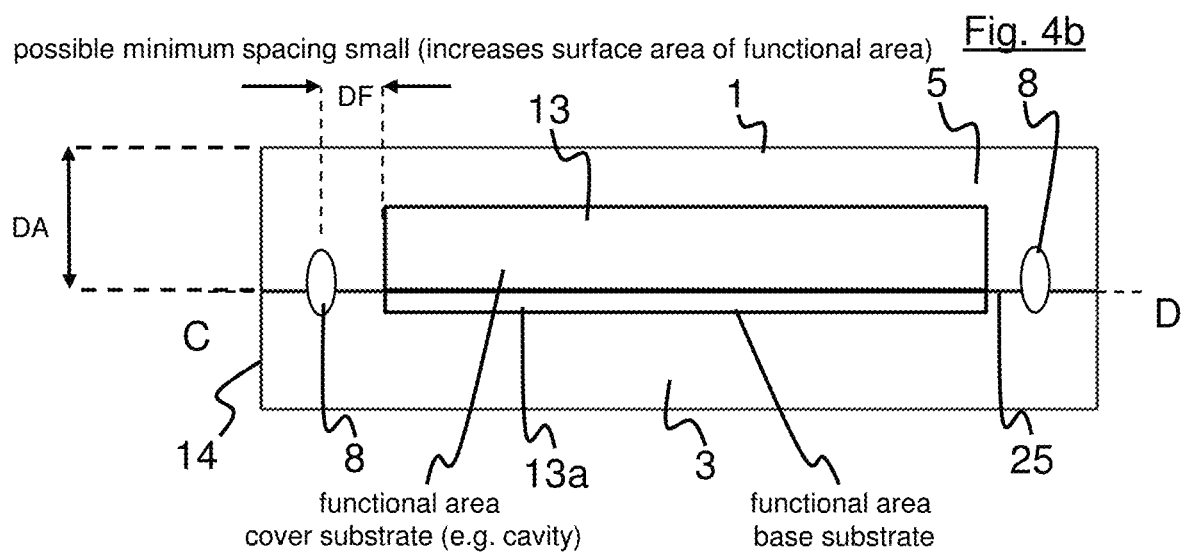
FIG. 4b is a sectional view along line C-D of an embodiment of a package as shown in FIG. 3.

FIG. 1a shows the accommodation item 2 to be protected, embedded by an intermediate substrate 4 on a lower substrate 3. The accommodation item 2 is covered by an upper substrate 5 to close the cavity 12. Thus, the three substrates 3, 4, 5 jointly define the package 1 around the accommodation item 2, which is disposed in the cavity 12. In other words, when the upper substrate 5 is placed on the intermediate substrate 4 in the example of FIG. 1a, a closed accommodation cavity 12 is formed, which will have to be hermetically sealed in subsequent steps. Here, the intermediate substrate 4 can be made of a different material than the lower substrate 3 and the upper substrate 5. Optionally, the intermediate substrate 4 and the upper substrate 5 are made of the same material. The illustrated layers 3, 4, 5 can be in the form of wafer discs, so that the package is formed by stacking three wafer discs on top of one another to form a wafer stack and by joining or welding them together.

FIG. 1b shows a hermetically sealed package 1 formed in this way. This package 1 includes the lower substrate, the intermediate substrate 4, and the upper substrate 5 stacked on top of one another, with a respective contact area 25 defined between the lower substrate 3 and the intermediate substrate 4 on the one hand, and between the intermediate substrate 4 and the upper substrate 5 on the other hand. As can also be seen from FIG. 1a, the intermediate substrate layer 4 is not a continuous layer; rather the accommodation cavity 12 is defined at the level of the intermediate substrate layer.

FIG. 1c shows a further embodiment of a package 1, with the accommodation item 2 disposed on the lower substrate 3. The upper substrate 5 is designed such that it has a hollowed out interior so as to define a collar, and the collar 5a is arranged around the accommodation item 2 when the package 1 is closed. Collar 5a of substrate 5 thus defines the rim and the upper side of the cavity 12 in which the accommodation item 2 is arranged.

FIG. 2 shows a detail of the joining area, in which the laser-bonded interface zone 7 and the laser welding zone 8 can be seen. Laser welding zone 8 is located in contact area or interface 25. Environmental influences can act on the package 1 from outside the package 1, in particular at the corners 6 of the laser-welded stack 18. The laser-welded zones 8 prevent the ingress of, for example, chemical solutions into the substrate stack 18 as far as to the accommodation cavity 12 and hence to the accommodation item 2.

FIG. 3 shows a plan view of a package 1 according to the invention, with the circumferential laser welding zone 8 surrounding the functional area 13. Functional area 13 may be implemented in different ways. Exemplary embodiments of functional area 13 as well as for other options of a package can be seen in FIGS. 4a through 6. The various designs of functional area 13 can all be schematically illustrated as in FIG. 3, as they will be similar in such a plan view. Lines A-B and C-D indicate section lines along which the sectional views of FIGS. 4a to 6 will be reproduced.

The functional area may implement various tasks, for example it may include an optical receiver or a technical, electro-mechanical, and/or electronic component which is disposed in the functional area 13. It is also possible to implement a plurality of such tasks in the functional area 13. On the upper side, the package 1 is covered by upper substrate 5. The laser welding zone 8 extends into this upper substrate 5.

Referring to FIG. 4a, there is shown a first sectional view of a first embodiment of a package 1, which includes the base substrate 3 and the cover substrate 5. In other words, the package consists of or is composed of two layers, namely base layer 3 and cover layer 5. FIG. 4a also shows the structure of laser welding line 8 in the form of a string of multiple laser pulse impact areas 16 which are placed so close to one another that the material of the base substrate 3 and of the cover substrate 5 seamlessly fuses to one another.

FIG. 4b shows a sectional view of an embodiment of a package 1 taken along line C-D as indicated in FIG. 3. Cover substrate 5 has a first toughened layer 47 at its upper or outer surface, which extends over a thickness DoL into the material of the cover substrate 5. In other words, cover substrate 5 and thus the package 1 is toughened at its upper surface, i.e. it has a toughened zone 47 there, so that the package 1 is toughened in sections thereof, namely on one side.

FIG. 4b furthermore shows a section through the functional area 13, 13a which extends inside the package 1, for example as a continuous cavity or hollow space. In other words, the cavity extends from base substrate 3 into the cover substrate 5 and, for example, is in the form of a recess made in the base substrate 3 and/or in the cover substrate 5. The functional area 13a may, for example, also include an active layer such as an electrically conductive layer, and the functional area 13 includes the cavity. The laser welding zone 8 provided circumferentially around the functional area 13, 13a seals the functional area 13, 13a all around along the lateral sides thereof. It is conceivable to leave gaps in the laser welding zone 8 so that the functional area 13, 13a will not be sealed all around, for example in order to keep open a communication channel which can be used to establish fluid communication with the environment, for example. In other words, it might be contemplated to not seal predefined locations or points using the focused laser beam 9, but to rather achieve a hermetic seal by other ways there, such as by an adhesive. Optionally, the functional area 13, 13a is sealed all of its sides and without any gaps.

Figure 5A:
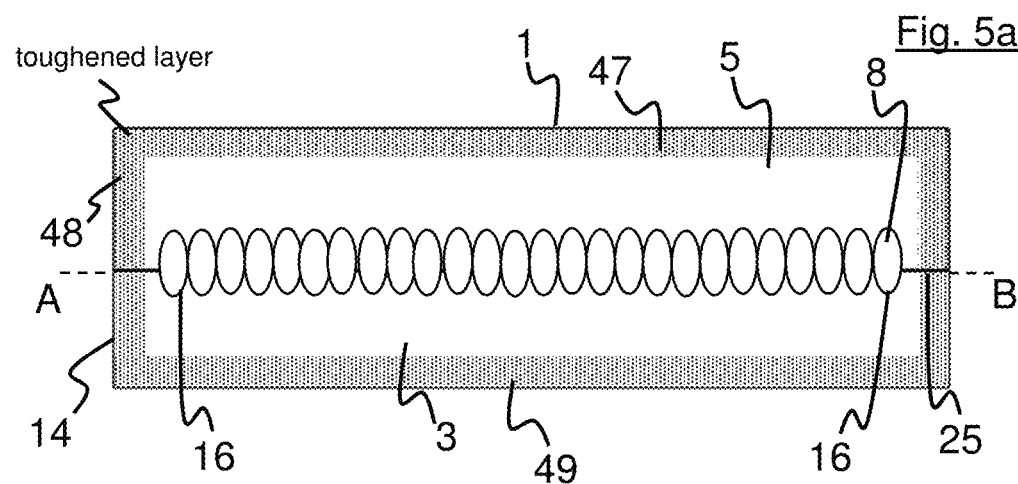
FIG. 5a is a sectional view along line A-B of an embodiment of a package as shown in FIG. 3.

Referring to FIG. 5a which shows a further embodiment in which incident laser pulses 16 create the laser welding zone 8 where the cover substrate 5 is welded or joined to the base substrate 3 along contact area 25. This embodiment has the further special feature to have the surfaces of the first substrate 3 and of the second substrate 5 toughened all around, that is to have toughened layers 47, 48, and 49.

For example, the cover substrate 5 can be dipped into a toughening bath with its upper side before being bonded to the base substrate 3, or else after having been bonded to the base substrate 3, so that the finished package 1 will be chemically toughened, i.e. will have at least one toughened surface 47 and/or at least one toughened layer. In other words, the finished package 1 is toughened at least partially or at least in sections thereof, in particular chemically toughened. With the chemical toughening, a compressive stress is established on the cover substrate 5. The first toughened layer 47 has the height DoL. The welding zone 8 has the height HL. A minimum material thickness MM remains between toughening zone 47 and welding zone 8. The entire thickness of cover substrate 5 may then be added up of HL+MM+DoL.

The functional area 13, 13a extends inwards of the toughened layers 47, 48, 49, with the toughened layer 48 being provided in an area laterally surrounding the functional area 13, 13a. Thus, in the embodiment shown in FIGS. 5a, 5b, the cover substrate 5 and also the base substrate 3 were toughened on both of its major sides, in particular chemically toughened in a toughening solution. In other words, the substrates 3, 5 were dipped into a toughening solution for being chemically toughened at their respective major sides, i.e. the respective upper and lower surfaces, for toughening the major sides.

In the embodiment shown in FIG. 5a, the package 1 is toughened on all outer surfaces, i.e. both the two opposite major surfaces have toughened layers 47 and 49, and the circumferential rim 14 of the package has a toughened layer 48, the circumferential rim 14 extending circumferentially around the package 1. In other words, in the case of a cuboid package, all four narrow sides that are found on a cuboid jointly form the rim 14. The rim 14 can also be understood or referred to as an edge 21 of the package, which extends around the cavity 12. A package 1 as shown in FIG. 5a can be obtained, for example, by immersing the finally welded package including the cover substrate 5 and the base substrate 3 in a toughening solution and in particular chemically toughening it there. The toughened layers 47, 48, 49 are thus disposed directly at the outer surfaces of the package 1. Thus, inwards of the toughened layers 47, 48, 49 there remains an area for the welding line 8, which is introduced with a spacing to the toughened layers 47, 48, 49, if possible.

FIG. 5b shows an embodiment of the package 1 in a sectional view taken along line C-D. Again, in this embodiment, the functional area 13, 13a is arranged such that it extends from the base substrate 3 into the cover substrate 5, for example in the form of a recess in the respective substrate. Such a recess 13, 13a can in particular be produced by a sandblasting process (see FIGS. 7 to 14). Welding line 8 is provided all around the recess 13, 13a, so that the recesses 13, 13a are hermetically sealed on all sides.

As in the embodiment of FIG. 5a, the package 1 is chemically toughened on all sides, in other words, it has a toughened zone 47, 48, 49 on all surfaces thereof. For example, a first toughened layer 47 is provided at the first major side which may be the upper surface of the cover substrate 5, a third toughened layer 49 is provided on a second major side which may be the lower surface of the base substrate 3, and the second toughened layer 48 is provided at the circumferential edge 21 or circumferential rim 14. The upper side 23 of the cavity is located inwards of the first toughened layer 47, the edge 21 of the cavity is located inwards of the second toughened layer 48, and the bottom 22 of the cavity is located inwards of the third toughened layer 49. Thus, the cavity or functional area 13, 13a is enclosed by toughened material 47, 48, 49 on all of its sides.

FIG. 6 shows a further embodiment of a package 1 along section line C-D, and in this example the functional area 13 or the cavity 12 is provided in the cover substrate 5. For example, only the cover substrate 5 may be hollowed out by the sandblasting process in this example, whereas the base substrate 3 does not have to be treated any further. Thus, manufacturing can be simplified since fewer parts of the package have to be processed.

In this example of FIG. 6, the cover substrate 5 has the toughening layer 47 on its major side and the toughening layer 48 on its rim 14. For example, the cover substrate 5 was dipped into a toughening solution, individually or after having been joined to the base substrate 3, with the upper surface of cover substrate 5 immersed in a toughening solution for chemical toughening to such an extent that the height of the second toughened layer 48 is achieved. In the present example, the base substrate 3 does not have any toughened zones. In this example, the lateral toughened zone 48 terminates directly at the contact area 25 between cover substrate 5 and base substrate 3. The joint along welding line 8 was made inwards of the toughening zone 48, that is in relaxed material. In other words, a first major side of the package 1 has the toughened layer 47, and a first minor side 14 has the toughened layer 48 along a section thereof. The toughened layer 48 may extend circumferentially around the package 1, for example around functional area 13. The sectional view shown here is taken along line C-D as indicated in FIG. 3, that is cutting through the functional area 13. In this embodiment, the functional area 13 is limited to the dimensions of cover substrate 5, so it does not extend into base substrate 3. The base substrate 3 is directly joined to the cover substrate 5, i.e. there is no further layer or no further substrate arranged between base substrate 3 and cover substrate 5. Functional area 13 is in the form of a cavity. The cavity may be introduced into the cover substrate 5 by a sandblasting process, for example, more generally by using an abrasive technique. Chemical etching is also possible for creating the cavity in the substrate.

Figure 7:
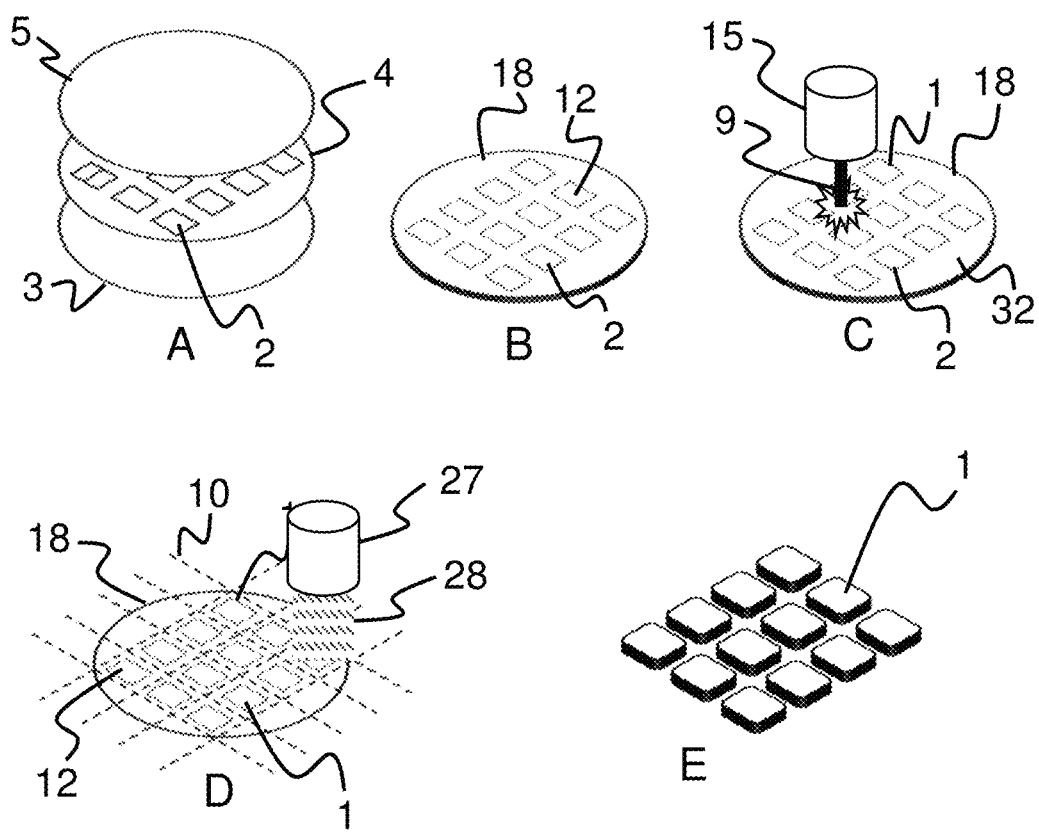
FIG. 7 illustrates a method for dicing a package according to the invention.

Referring to FIG. 7 which shows a first embodiment of the method for producing a package according to the invention. In a step A, the substrates 3, 4, 5 and the accommodation items 2 to be accommodated are aligned. The upper substrate 5 is placed on the intermediate substrate 4 which in turn is placed on the lower substrate 3 such that a substrate stack 18 is formed. Since the intermediate substrate 4 which includes the recesses that define the cavities 12 is arranged in a sandwiched relationship, the accommodation cavities 12 will subsequently be enclosed by substrate material on all sides inside the substrate stack 18. In other words, aligning the substrates 3, 4, 5 in step A creates the enclosed nature of the cavity 12 surrounded all around by edge 21, bottom 22, and upper side 23. Optionally, the substrates may be joined to one another, in particular fixed by optical contact bonding, for example, to secure them in position.

Step B of the method illustrated in FIG. 7 shows the stack of substrates 18 arranged one above the other, with cavities 12 for holding accommodation items 2 provided in the interior thereof. Optionally, the substrate stack 18 is bonded by optical contact bonding, for example by using water on the surface and involving the generation of hydrogen bridge bonds. In this closed form, this substrate stack 18 can be fed to the joining process, in which the layers are welded together to form a firmly bonded stack 18, so that packages 1 are obtained from this substrate stack 18. Substrates 3, 4, 5 may be wafer discs, for example, so that the package is formed by the wafers enclosing the accommodation cavity 12 together as a wafer stack 18 and forming the package 1.

Step C shows the laser welding of the respective accommodation cavities 12, that is the sealing of the cavities 12 on all sides along the contact areas 25. For this purpose, a laser unit 15 is guided over the surface of the substrate stack 18 from above the substrate stack 18 and a focused laser beam 9 is selectively directed to the zones to be joined. The laser welding lines may, for example, be created in the form of a grid of intersecting lines. Drawing two or more laser welding lines in parallel can also be implemented if this proves to be advantageous for later dicing, for example, depending on the material. Once step C of the fabrication process has been completed, all of the cavities 12 will have been hermetically sealed.

At the latest after step C, optionally even earlier, the surface of substrate 5, onto which the particle jet 28 will subsequently impinge, can be treated with a protective agent 32. For example, a protective resist 32 is applied to the substrate 5 at the locations where no material should be removed. In this example, the majority of the surface would be provided with the protective resist 32 since the particle jet process is only intended to achieve the separation or dicing of the packages 1. The treatment of the surface with protective agent 32 can optionally be followed by a lithography step.

Step D shows the step of separating or cutting the substrate stack 18 for dicing the packages 1. The cutting is effected using a particle jet 28 which is provided by a particle jet generator 27. For example, the particle jet 28 can be directed along separating or cutting lines 10, and the substrate stack can be cut or separated by the abrasive effect of the particle jet 28 on the substrate. It has turned out to be advantageous if the particle jet 28 is provided as a widely fanned compressed air jet which is directed onto the surface of the package 1. Remaining areas are defined by applying resist, for example a lithography resist, to areas such as webs on the surface of the package 1 to be irradiated, i.e. to areas that must not be ablated or should be significantly less ablated by the particle jet 28. The particle jet 28 may include SiC particles. The lithography resist can be applied in a layer thickness of 17 μm, for example, i.e. in particular in a thickness between 5 and 25 μm, for example depending on how deep the cavity or the functional areas 13 are to be hollowed out.

Finally, step E shows the individual, hermetically sealed packages 1 with accommodation cavities 12 provided inside thereof.

Referring to FIG. 8 which shows a further embodiment of the method for producing packages 1 according to the invention. The substrate 5 as provided has already been provided with a resist 32 on the surface that will later be exposed to the particle jet 28, for example by spin-coating, and has been subjected to a lithography step. Then, in a step A, cavities can be produced in the substrate 5 using the particle jet 28 and particle jet generator 27. The particle jet 28 is directed over the substrate 5 in such a way that the cavities are removed from the substrate 5, by particles of the particle jet ablating small particles of the substrate 5 in an abrasive manner. With increasing exposure time of the substrate 5 to the particle jet 28, the penetration depth and ablation depth of the particle jet increases. In the case of a narrow particle jet 28, the latter is directed onto the areas in which a cavity 12 is to be produced. It is also possible to adjust the size of the cavity 12 through the emission range of the particle jet 28 and to set the respective depth of the respective cavity 12 through the duration of impact of the particle jet 28 on the respective cavity 12. Optionally, a large-area particle jet 28 is used in this case, and the protective agent or resist 32 is applied to the substrate 5 in such a way that the dimensions of the respective functional areas 12, 13, 13a are exposed to the abrasive process.

In other words, the method presented herein allows to produce a cavity 12 that can be freely designed in terms of its shape, geometric dimensions, and depth. For example, a cavity may even have a bump on its top, by only briefly directing the particle jet 28 onto the central area of the cavity, or in the case of resist application, some area can be protected with resist there, so that more material will be retained there than in the adjoining areas of the cavity 12 onto which the particle jet 28 is directed for a longer time duration or which are not provided with protective resist. With regard to its shape, the cavity 12 can be adapted to the requirements, so that circular, oval, polygonal, and any other desired shape of the cavity can be adjusted in addition to the typical square shape. As already mentioned above in conjunction with other embodiments, the aforementioned shapes can also be obtained by an advantageous application of resist, so that the areas to which resist is applied are not removed by the particle jet 28 but rather define remaining areas.

In step B, the two substrates 3 and 5 are aligned with one another, with the accommodation items 2 that are to be arranged inside the cavities 12 that were provided in substrate 5 already placed on the lower substrate 3.

Step C shows the substrate stack 18 superimposed, with the accommodation items 2 countersunk in the cavities 12 in alignment, so that they are surrounded on all sides by substrate material.

Step D of the method shows the hermetic sealing of the respective individual cavities 12 using the laser welding process during which a laser beam 9 is guided by laser beam generator 15 around each cavity 12 along the interface 25.

In other words, the substrate materials are welded together around each cavity 12 by the joining method according to the invention using the laser 9. Subsequent to step D, a resist 32 can again be applied in order to protect the areas of the substrate from which little or no substrate material should be removed.

Step E shows the separation of the wafer 18 or dicing of the packages 1. For this purpose, the laser 9 which was also used for laser welding the accommodation cavities 12 in step D can be employed to cut the substrate, for example, or the particle jet 28 can be used for separating the packages 1.

Step F shows the separated, hermetically sealed packages 1 with accommodation cavities 12 provided inside thereof.

Figure 9:
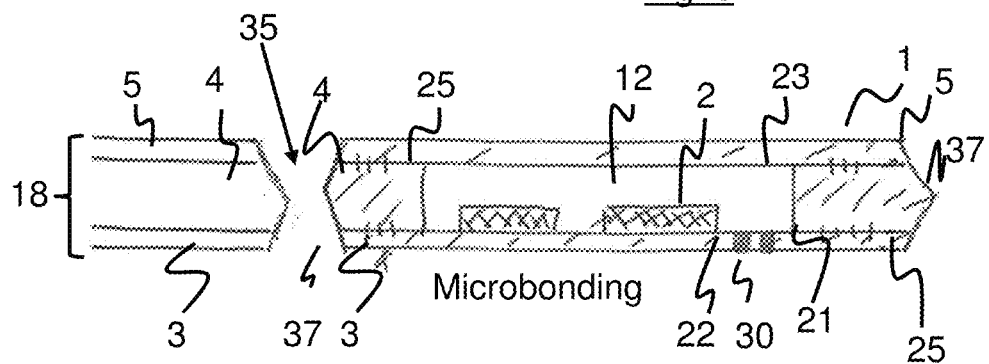
FIG. 9 shows a sectional view through a package that includes three substrate layers.

FIG. 9 is a sectional view through a hermetically sealed package 1. The lower substrate 3 defines the bottom 22 of cavity 12, the intermediate substrate 4 defines the edge 21 of cavity 12, an upper substrate 5 defines the upper side 23 of cavity 12. In other words, the lower substrate 3, the intermediate substrate 4, and the upper substrate 5 in the form of a substrate stack 18 conjointly enclose the accommodation cavity 12. The accommodation item 2 is disposed inside of cavity 12. In this example, all three substrates 3, 4, 5 are glass substrates, i.e. they are optically transparent. Intermediate substrate 4 may in particular be a Flexinity® wafer. The three substrates 3, 4, 5 are joined together by microbonding. The substrate stack 18 has a typical thickness of between 1 and 3 mm, the typical substrate format may assume a typical wafer format of between 1 inch and 12 inches, for example.

Vias, also known as Through Glass Vias (TGVs) may be provided in the bottom 22 of cavity 12, that is, for example, hermetic, electrically conductive connections for establishing electrical contact to the accommodation items 2. Substrate 3 may be in the form of a wafer, for example, which may contain vertical needles made of tungsten or platinum (also known as a HERMES wafer), or in the form of a glass substrate that includes laser-drilled holes, for example, which were filled with metal using a screen printing or stencil printing process, for example. A second package is located to the left of the described package.

The separation area between the two packages was cut out using a particle jet 28. When the particle jet 28 is used for the cutting process, flanks 37 will be formed on the outer surfaces of the substrate stack 18 at the separation site 35.

Figure 10:
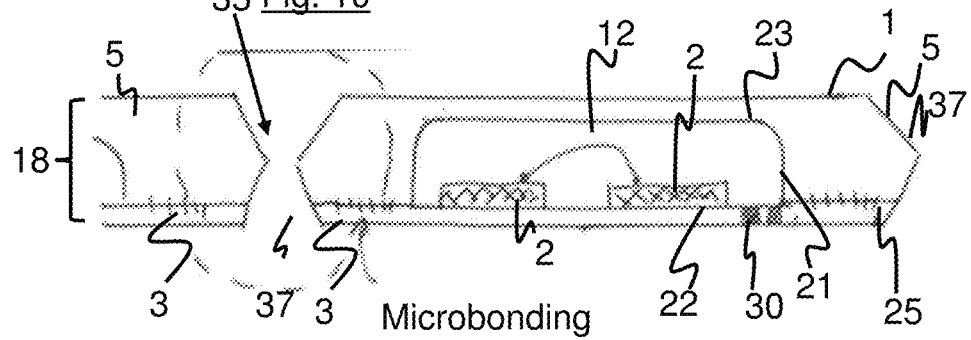
FIG. 10 shows a sectional view through a further embodiment of the package which includes two substrate layers.

Referring to FIG. 10 which shows a sectional view of a further embodiment, in which a lower substrate 3 has been joined to an upper substrate 5 by a laser welding process. Two accommodation items 2 are disposed in cavity 12, and this cavity 12 was hollowed out of the upper substrate 5 using the particle jet 28. This method involving hollowing out the cavity from the upper substrate 5 using a particle jet 28 provides for a further reduction in the number of components of the package for the later intended use, i.e. for example the microsensor or bio-implant. Only two substrate layers are required in this example, whereas at least three substrate layers would typically be necessary without the use of the abrasive process.

The edges were also cut using the particle jet process, so that the flanks 37 according to the invention are formed on the lateral side of the package 1.

Figure 11:
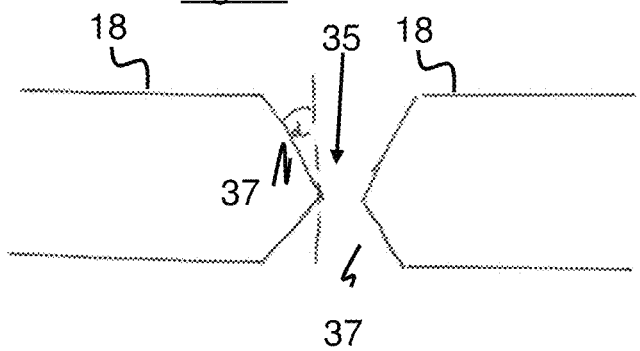
FIG. 11 is a sectional view of a typical rim profile.

By way of example, FIG. 11 shows the flank angle α of the flank 37 as a result of the sandblasting process using particle jet 28. A typical flank angle α of 20° relative to the normal to the substrate surface has been found experimentally; it can be adjusted to be inclined between 10° and 45° relative to the normal to the substrate surface.

The cavities 12 can also be etched into a substrate such as a wafer 4, 5 using an appropriate solvent, although the particle jet process using the particle jet 28 has been found to be better controllable and to provide a better shape distribution of the cavities 12, since both the shape and the depth of the cavity can be adjusted via beam parameters.

In summary, the present invention provides a significant improvement of the prior art method of manufacturing packages, since fewer materials can now be used, i.e. in particular one substrate layer or one wafer less, and secondary materials such as adhesives can also be dispensed with in this way. Alternatively or cumulatively, the present invention shows the generation of flank angles on the outer edges of the package 1, which can ensure better material compatibility, i.e. in particular biocompatibility. Moreover, the edges that have flanks 37 are less prone to breaking out, so that both the resistance and likewise the robustness to mechanical impacts is increased. Sharp edges, by contrast, tend to break out more frequently during handling and use. The use of the particle jet 28 for dicing the individual packages 1 moreover allows to produce any arbitrary contours or shapes of the packages 1, such as circular, oval, polygonal shapes. This is another advantage compared to former sawing process, more generally cutting process.

Figure 12A:
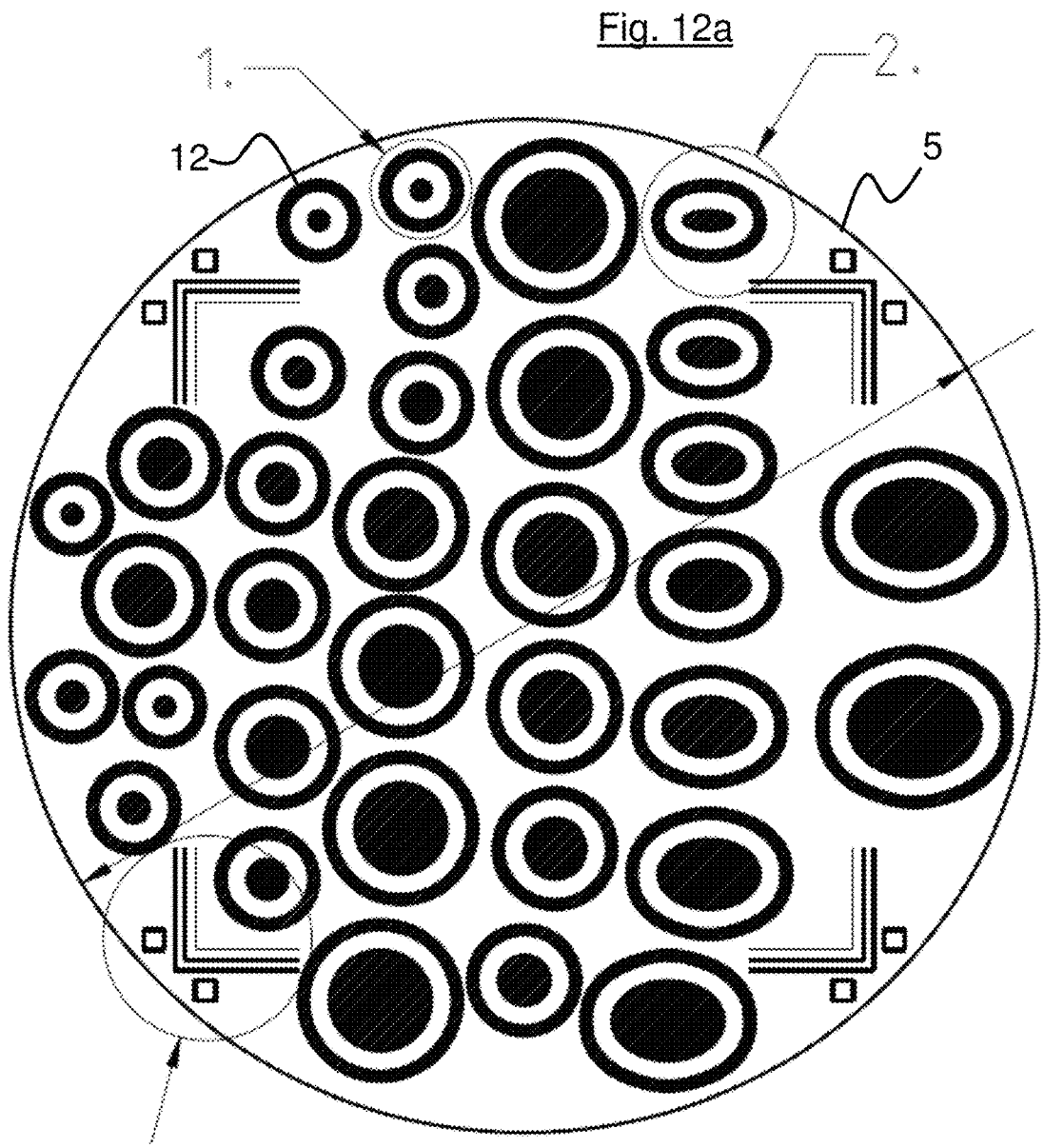
FIG. 12a shows an exemplary design of a wafer with free shaping.

FIG. 12a shows an exemplary design of an upper substrate 5, into which cavities 12 have been introduced using the particle jet 28. The individual cavities differ in terms of their shape and size. In this example, circular and oval shapes were chosen. The wafer 5 of the illustrated example has an exemplary overall diameter of 100 mm. Support points for a support which holds the wafer during the welding and/or separation step are provided in the corners indicated on the wafer.

Figure 12B:
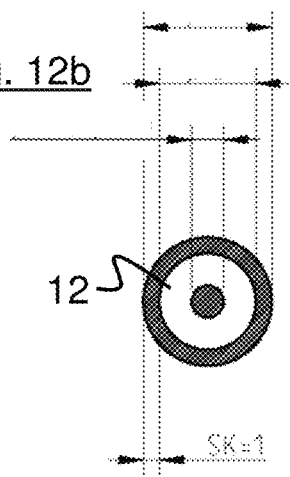
FIG. 12b shows an exemplary circular package.
Figure 12C:
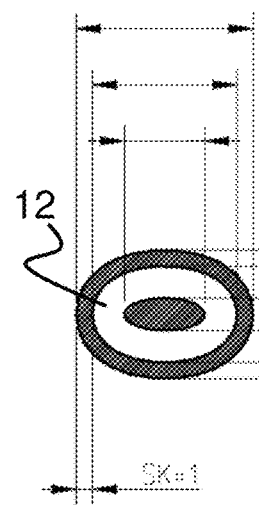
FIG. 12c shows an exemplary oval package.

FIG. 12b shows an example of a cavity that was introduced at the location designated by digit 1 in FIG. 12a. The cavity has an inner diameter of 6 mm, for example. Referring to FIG. 12c, a further exemplary cavity 12 is shown, which is arranged at the location designated by digit 2 in FIG. 12a.

Figure 13A:
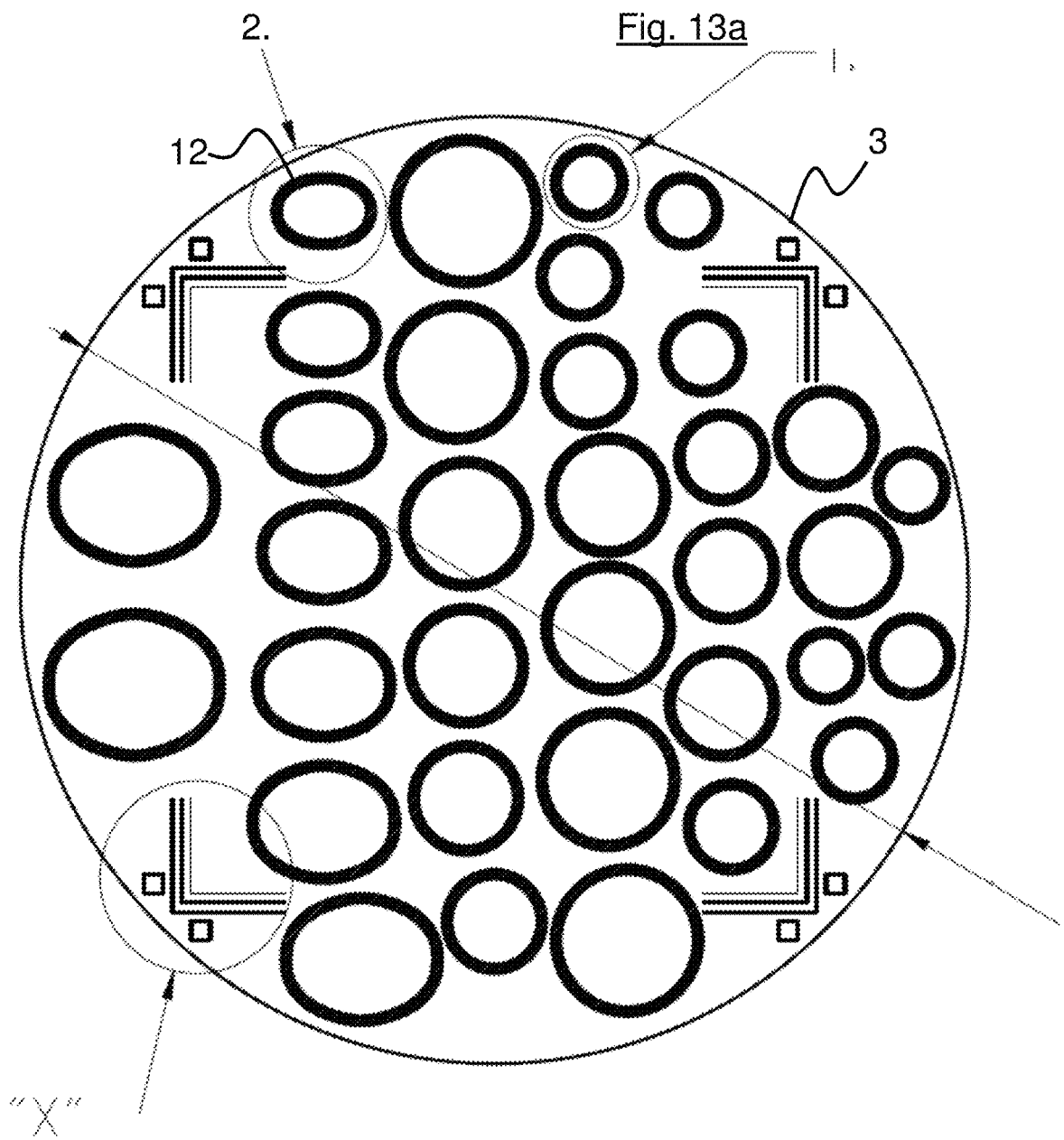
FIG. 13a shows an exemplary design of the second wafer with free shaping.
Figure 13B:
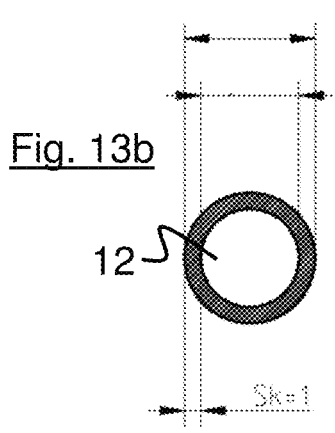
FIG. 13b shows an exemplary shape of a circular package.
Figure 13C:
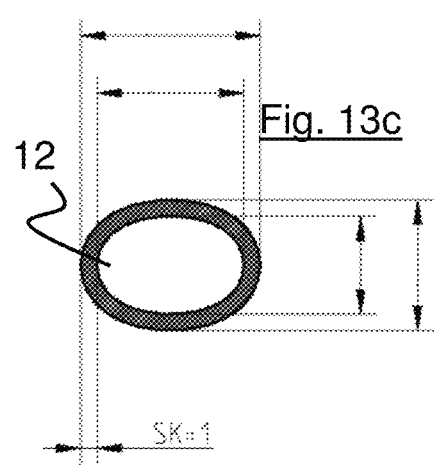
FIG. 13c shows an exemplary shape for an oval package.

Referring to FIG. 13a which shows a lower substrate 3 that is marked, for example by separation lines, for receiving accommodation items 2 at intended locations in the wafer. The separation lines may advantageously also be used for the laser welding process. Referring to FIG. 13b, the cavity is shown which is provided at the location indicated by digit 1 in FIG. 13a. FIG. 13c shows the cavity 12 indicated by the digit 2.

Figure 14:
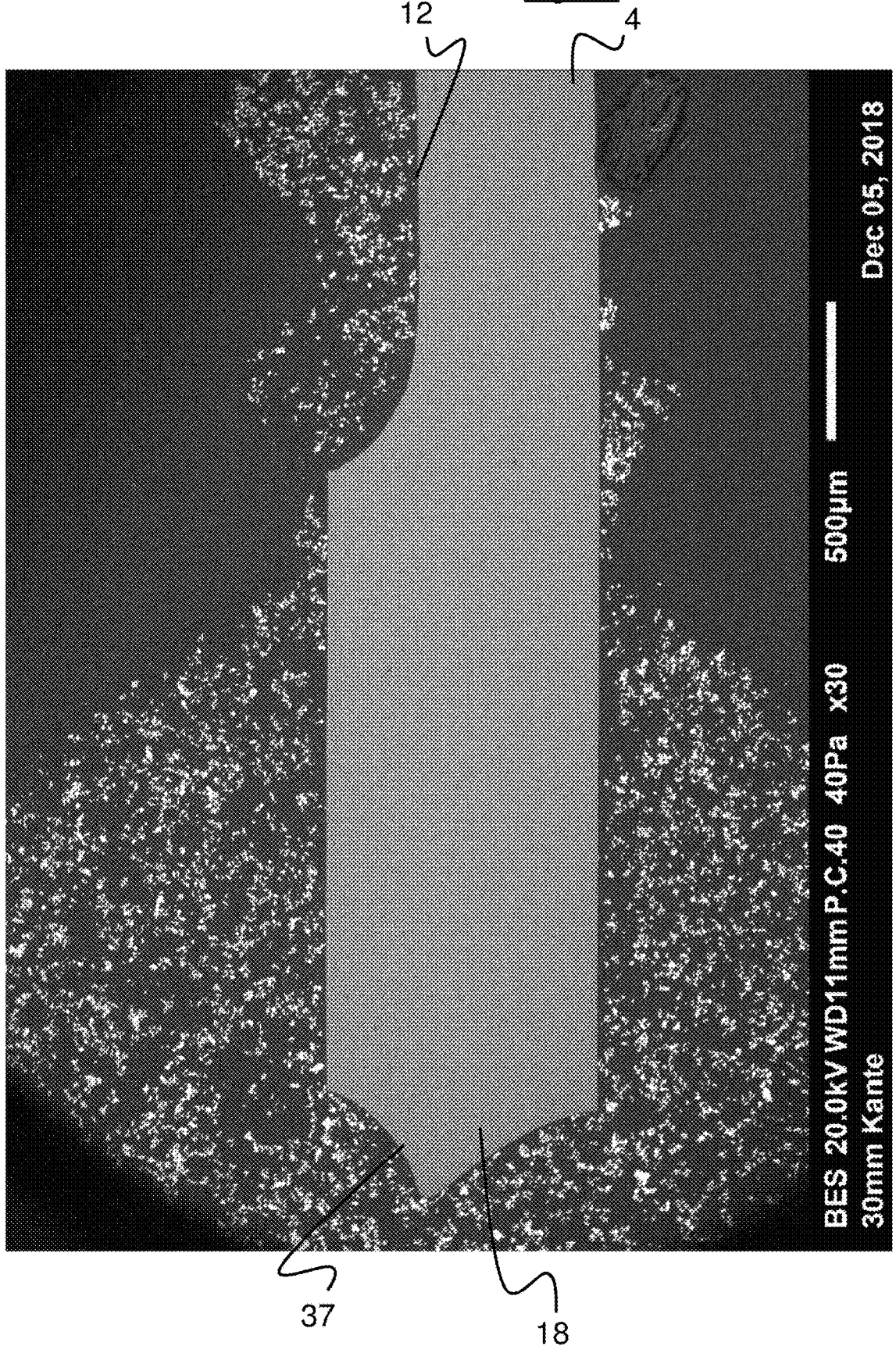
FIG. 14 shows a micrograph of a transparent substrate with hollowed-out cavity and particle-blasted rim.

Referring to FIG. 14 which shows a micrograph of a substrate 4 in which both the cavity 12 was hollowed out using a particle jet and the separation was achieved using a particle jet 28, so that the flanks 37 according to the invention have been formed.

Figure 15:
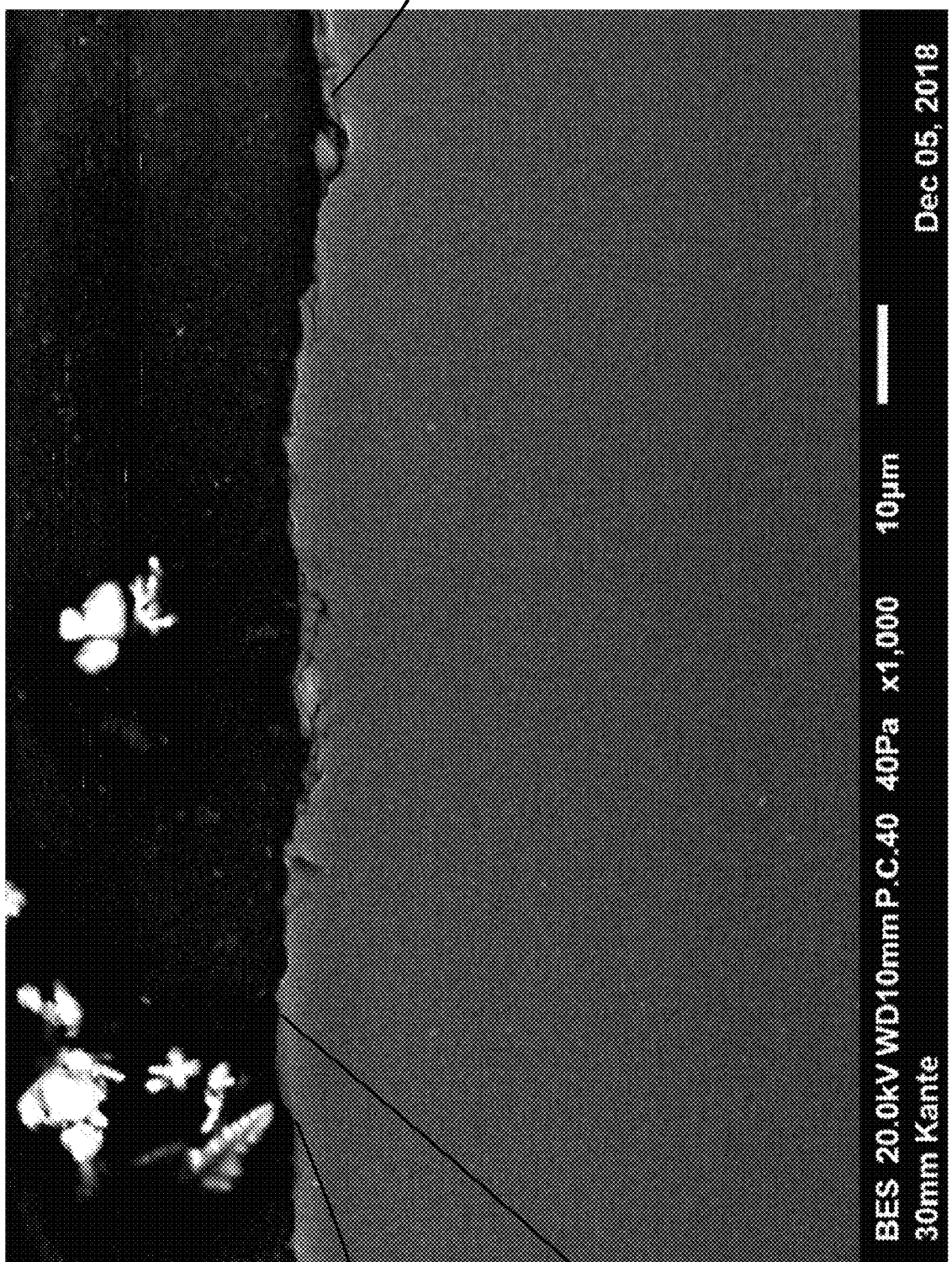
FIG. 15 shows a micrograph illustrating the surface roughness of a particle-blasted cavity.

Referring to FIG. 15 which shows a micrograph of the cavity 12 from one side, such that the microscopically small unevenness at the upper surface of the cavity 12 becomes evident. The illustrated surface roughness of the cavity may be loaded by fine dust at the upper surface 23 thereof, for example. Within the context of the invention it was demonstrated that rinsing or wetting the surface with a liquid is already sufficient for the cavity to become optically transparent.

It will be apparent to a person skilled in the art that the embodiments described above are meant to be exemplary and that the invention is not limited thereto but may be varied in many ways without departing from the scope of the claims. Furthermore, it will be apparent that irrespective of whether disclosed in the description, the claims, the figures, or otherwise, the features individually define essential components of the invention, even if they are described together with other features. Throughout the figures, the same reference symbols designate the same pieces of subject-matter, so that a description of pieces of subject-matter that are possibly only mentioned in one or at least not in conjunction with all figures can also be transferred to such figures with regard to which the piece of subject-matter has not explicitly been described in the specification.

LIST OF REFERENCE NUMERALS

1 Hermetically sealed, chemically toughened package
2 Accommodation item
3 Lower substrate, lower wafer, lower cover
4 Intermediate substrate, intermediate wafer
5 Upper substrate, upper wafer, upper cover
6 Corner of laser-welded stack 18
7 Laser-welded interface zone
8 Laser welding zone, laser bonding line
9 Focused laser beam
10 Separation or cutting lines
12 Accommodation cavity
13 Functional area
13a Second functional area
14 Rim
15 Laser unit for welding and/or cutting
16 Laser pulse impact area
18 Stack
21 Edge
22 Bottom of cavity
23 Upper side of cavity
25 Contact area or interface
27 Particle jet generator
28 Particle jet
30 Microchannel
35 Separation site or separation zone
37 Flank
47 Toughened zone or first toughened layer
48 Toughened zone or second toughened layer
49 Toughened zone or third toughened layer While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A hermetically sealed package, comprising:
a base substrate;
a cover substrate, the base substrate and the cover substrate defining at least two parts respectively of the hermetically sealed package, the at least two parts of the hermetically sealed package being joined, at least indirectly, together by at least one laser bonding line to form the hermetically sealed package, the at least one laser bonding line forming a string of multiple laser pulse impact areas;
at least one functional area enclosed by the hermetically sealed package;
one of:
(a) the cover substrate integrally defining both a lateral circumferential edge of a cavity and an upper side of the cavity of the hermetically sealed package, and the base substrate being hermetically joined to the cover substrate by the at least one laser bonding line, such that the hermetically sealed package is formed by only two of the at least two parts, the hermetically sealed package further including at least one of a lateral circumferential rim and a plurality of rim faces having a flank including an upper segment and a lower segment which are angled relative to one another and to a plane normal to the base substrate, the cover substrate and not the base substrate defining the upper segment, the cover substrate in part and the base substrate in part defining the lower segment; and
(b) at least one of a lateral circumferential rim and a plurality of rim faces of the hermetically sealed package having a flank angle relative to a surface normal of the base substrate of between 10 and 45 degrees, between 15 and 30 degrees, or between 18 and 25 degrees relative to the surface normal of the base substrate, the hermetically sealed package further including an intermediate substrate, wherein at least one of the lateral circumferential rim and the plurality of rim faces of the hermetically sealed package having a flank including an upper segment and a lower segment which are angled relative to one another and to a plane normal to the base substrate, the cover substrate in part and the intermediate substrate in part defining the upper segment, the intermediate substrate in part and the base substrate in part defining the lower segment, the intermediate substrate including an upper part and a lower part, the upper segment and the lower segment of the flank being angled relative to one another so as to form the flank angle which includes a vertex, the upper segment being above the vertex and the lower segment being below the vertex such that the upper part of the intermediate substrate is above the vertex and the lower part of the intermediate substrate is below the vertex, the upper segment of the flank and the lower segment of the flank contacting each other at the vertex.

2. The hermetically sealed package of claim 1, wherein at least one of: the hermetically sealed package further comprises an intermediate substrate which defines the lateral circumferential rim of the hermetically sealed package; and the at least one laser bonding line encloses the at least one functional area circumferentially at a distance therefrom.

3. The hermetically sealed package of claim 2,
wherein the at least one functional area comprises a hermetically sealed cavity, formed as a hermetically sealed accommodation cavity configured for accommodating an accommodation item formed as an electronic circuit, a sensor, or a micro-electromechanical system;
wherein the hermetically sealed cavity has a depth in a direction of the surface normal to the cover substrate; and at least one of:
wherein the depth of the hermetically sealed cavity varies over a surface area of the hermetically sealed cavity by less than 30% or less than 15% of the depth; and
wherein the depth of the hermetically sealed cavity varies by more than 10%, more than 5%, or more than 2% over the surface area of the hermetically sealed cavity.

4. The hermetically sealed package of claim 2, wherein at least one of the base substrate, the cover substrate, and the intermediate substrate is transparent at least in portions thereof and at least for one range of wavelength.

5. The hermetically sealed package of claim 2, wherein at least one of:
   the base substrate, the cover substrate, and at least one of the intermediate substrate are welded together by the at least one laser bonding line using a laser welding process; and
   at least one of the base substrate, the intermediate substrate, and the cover substrate are made of a glass, glass ceramics, silicon, sapphire, or a combination of thereof.

6. The hermetically sealed package of claim 1, wherein at least one of:
   the at least one functional area has been introduced into the cover substrate by an abrasive process; and
   the hermetically sealed package is configured for having been separated from further hermetically sealed packages by an abrasive process.

7. The hermetically sealed package of claim 1, further comprising a support structure for a tissue for promoting a bond between the hermetically sealed package and the tissue;
   wherein the support structure is provided on the lateral circumferential rim of the hermetically sealed package;
   wherein at least the cover substrate comprises a vitreous material.

8. A hermetically sealed package, comprising:
   a base substrate;
   a cover substrate, the base substrate and the cover substrate defining at least two parts respectively of the hermetically sealed package, the at least two parts of the hermetically sealed package being directly joined together by at least one laser bonding line—and thus without using a secondary material—to form the hermetically sealed package, the at least one laser bonding line forming a string of multiple laser pulse impact areas;
   at least one functional area enclosed by the hermetically sealed package; and
   at least one of a lateral circumferential rim and a plurality of rim faces of the hermetically sealed package having a flank angle relative to a surface normal of the base substrate of between 10 and 45 degrees, between 15 and 30 degrees, or between 18 and 25 degrees relative to the surface normal of the base substrate.

* * * * *